(12) United States Patent
Sun

(10) Patent No.: US 10,635,214 B1
(45) Date of Patent: Apr. 28, 2020

(54) PRESS-TOUCH-CONTROL DEVICE HAVING SCREEN DISPLAY

(71) Applicant: Jen-Wen Sun, New Taipei (TW)

(72) Inventor: Jen-Wen Sun, New Taipei (TW)

( * ) Notice: Subject to any disclaimer, the term of this patent is extended or adjusted under 35 U.S.C. 154(b) by 0 days.

(21) Appl. No.: 16/150,276

(22) Filed: Oct. 3, 2018

(51) Int. Cl.
*G06F 3/041* (2006.01)
*G06F 1/16* (2006.01)

(52) U.S. Cl.
CPC .......... *G06F 3/0412* (2013.01); *G06F 1/1643* (2013.01); *G06F 3/0414* (2013.01)

(58) Field of Classification Search
CPC ..... G06F 3/0412; G06F 1/1643; G06F 3/0414
See application file for complete search history.

(56) References Cited

U.S. PATENT DOCUMENTS

| | | | | |
|---|---|---|---|---|
| 4,987,279 A * | 1/1991 | Hirose | ............ | H01H 9/181 200/312 |
| 5,278,362 A * | 1/1994 | Ohashi | ............ | H01H 9/181 200/314 |
| 7,342,186 B2 * | 3/2008 | Montalvo | ............ | G05G 1/08 200/11 R |
| 7,550,685 B2 * | 6/2009 | Tsuduki | ............ | H01H 25/041 200/14 |
| 7,554,047 B2 * | 6/2009 | Verdu | ............ | H01H 13/023 200/314 |
| 7,745,742 B2 * | 6/2010 | Li | ............ | H01H 25/041 200/5 A |
| 7,804,037 B2 * | 9/2010 | Cove | ............ | H01H 9/181 200/314 |
| 8,080,751 B2 * | 12/2011 | Onuki | ............ | H01H 13/023 200/314 |
| 8,624,141 B2 * | 1/2014 | Schechtel | ............ | H01H 13/83 200/310 |
| 9,240,294 B2 * | 1/2016 | Liu | ............ | H01H 13/10 |
| 9,881,752 B2 * | 1/2018 | Harazawa | ............ | H01H 9/56 |
| 10,149,080 B2 * | 12/2018 | Kim | ............ | H04R 31/00 |
| 10,204,513 B2 * | 2/2019 | Kim | ............ | G08C 23/04 |
| 10,312,029 B2 * | 6/2019 | Augustin | ............ | H01H 13/023 |
| 10,353,510 B2 * | 7/2019 | Kerr | | |
| 2007/0235306 A1 * | 10/2007 | Chiba | ............ | H01H 13/83 200/314 |
| 2009/0115748 A1 * | 5/2009 | Tanaka | ............ | G06F 3/0338 345/184 |

(Continued)

*Primary Examiner* — Nitin Patel
*Assistant Examiner* — Amy Onyekaba
(74) *Attorney, Agent, or Firm* — Leong C. Lei

(57) ABSTRACT

A press-touch-control device having screen display, which comprises: a button housing comprising a housing up-cover and a housing down-cover; a button seat set on the housing down-cover; a button down-cover set in the button housing; an elastic element set between the button seat and the button down-cover; a signal board and a button up-cover set on the button down-cover; a signal connecting-piece connected with the signal board; a display module set on the button up-cover; a touch-control element set on the display module and a perforation set on the housing up-cover. With the above structure, the user can control the touch-control element, such as touching, sliding, etc., or pressing the touch-control element to press the button seat linkly; and the signal board transmits the signal to the display module to change its content; so that the button can simultaneously have the functions including touch-control, press, and display.

8 Claims, 12 Drawing Sheets

(56) References Cited

U.S. PATENT DOCUMENTS

| | | | | |
|---|---|---|---|---|
| 2010/0133073 | A1* | 6/2010 | Su | H01H 25/041 |
| | | | | 200/4 |
| 2010/0213038 | A1* | 8/2010 | Sun | G09F 9/00 |
| | | | | 200/61.1 |
| 2010/0270133 | A1* | 10/2010 | Baker | H01H 25/041 |
| | | | | 200/4 |
| 2011/0127149 | A1* | 6/2011 | Sun | H01H 13/83 |
| | | | | 200/314 |
| 2013/0026017 | A1* | 1/2013 | Verd Martinez | H01H 9/161 |
| | | | | 200/307 |
| 2013/0127782 | A1* | 5/2013 | Lochner | H03K 17/962 |
| | | | | 345/174 |
| 2013/0147850 | A1* | 6/2013 | Li | G06F 3/0414 |
| | | | | 345/684 |
| 2013/0220779 | A1* | 8/2013 | Kerner | H01H 19/11 |
| | | | | 200/4 |
| 2014/0149064 | A1* | 5/2014 | Davidson | G06F 15/00 |
| | | | | 702/130 |
| 2015/0363087 | A1* | 12/2015 | Lee | B60K 35/00 |
| | | | | 715/771 |
| 2017/0075476 | A1* | 3/2017 | Kwon | G06F 3/04883 |
| 2017/0147130 | A1* | 5/2017 | Kwon | B60R 16/023 |
| 2017/0163437 | A1* | 6/2017 | Yang | G05B 11/01 |
| 2017/0315628 | A1* | 11/2017 | Yao | G06F 3/0416 |
| 2018/0373350 | A1* | 12/2018 | Rao | B60K 35/00 |
| 2019/0102969 | A1* | 4/2019 | Lapalme | G07F 17/3209 |

* cited by examiner

US 10,635,214 B1

PRESS-TOUCH-CONTROL DEVICE HAVING SCREEN DISPLAY

(a) TECHNICAL FIELD OF THE INVENTION

The present invention provides a press-touch-control device having screen display, and especially provides a press-touch-control device having screen display which simultaneously has the functions of press, touch-control, and display.

(b) DESCRIPTION OF THE PRIOR ART

Although full automation is the goal of all current technologies, even if it is fully automated, it needs people to adjust or modify. Moreover, full automation is still quite difficult for some machines, so some operating mechanisms are still needed to assist.

In general, the most commonly used tools for manipulating machinery are the joystick and the button. Most of the mechanical operations are made up of these two tools.

Most of the applications which the joystick can be used are the adjustment of the position and direction.

On the other hand, the types of buttons are quite diverse, and in addition to being able to adjust the position and direction, it can also have the function of turn-on or turn-off. However, a general button has only one control function, such as pressing or touch-controlling, and cannot have multiple control functions at the same time, and cannot display the result of the control on the button either.

SUMMARY OF THE INVENTION

The main objective of the present invention is lied in that: The button can be simultaneously controlled by touch-control or press through the touch-control element, the display module, and the button seat to achieve the advantage of having multiple usage functions.

In order to achieve the above objectives, the main structure of the present invention comprises: a button housing comprising a housing up-cover and a housing down-cover; a button seat set on the housing down-cover; a button down-cover set in the button housing; an elastic element set between the button seat and the button down-cover; a signal board set on the button down-cover; a signal connecting-piece connected with the signal board; a button up-cover set on the button down-cover; a display module set on the button up-cover; a perforation set on the housing up-cover; and a touch-control element set on the display module and located at the perforation; wherein the button down-cover can be selectively touched the button seat to transmit signals, and the display module and the touch-control element can be strongly rebound to signally connect with the signal board.

With the above structure, the user can connect one end whereof the signal connecting-piece which is backwards away from the signal board with a control circuit board to transmit or receive signals. And, the touch-control element can be touched or slided at the perforation to transmit the touch-control signal to the signal board, or the touch-control element can be pressed to linkly move the display module and to push the button up-cover and the button down-cover. By pressing the button seat to transmit the pressing signal, which the control circuit board can receive the above-mentioned touch-control signal and the press signal, and feedback the signal to the display module to change the display content of the display module; for example, after touching or pressing, change the displayed "Open" to the displayed "Close", etc.; so that the button can simultaneously have the functions including touch-control, press, and display.

DETAILED DESCRIPTION OF THE PREFERRED EMBODIMENTS

The following descriptions are exemplary embodiments only, and are not intended to limit the scope, applicability or configuration of the invention in any way. Rather, the following detailed description provides a convenient illustration for implementing exemplary embodiments of the invention. Various changes to the described embodiments may be made in the function and arrangement of the elements described without departing from the scope of the invention as set forth in the appended claims.

The foregoing and other aspects, features, and utilities of the present invention will be best understood from the following detailed description of the preferred embodiments when read in conjunction with the accompanying drawings.

Figure 1:
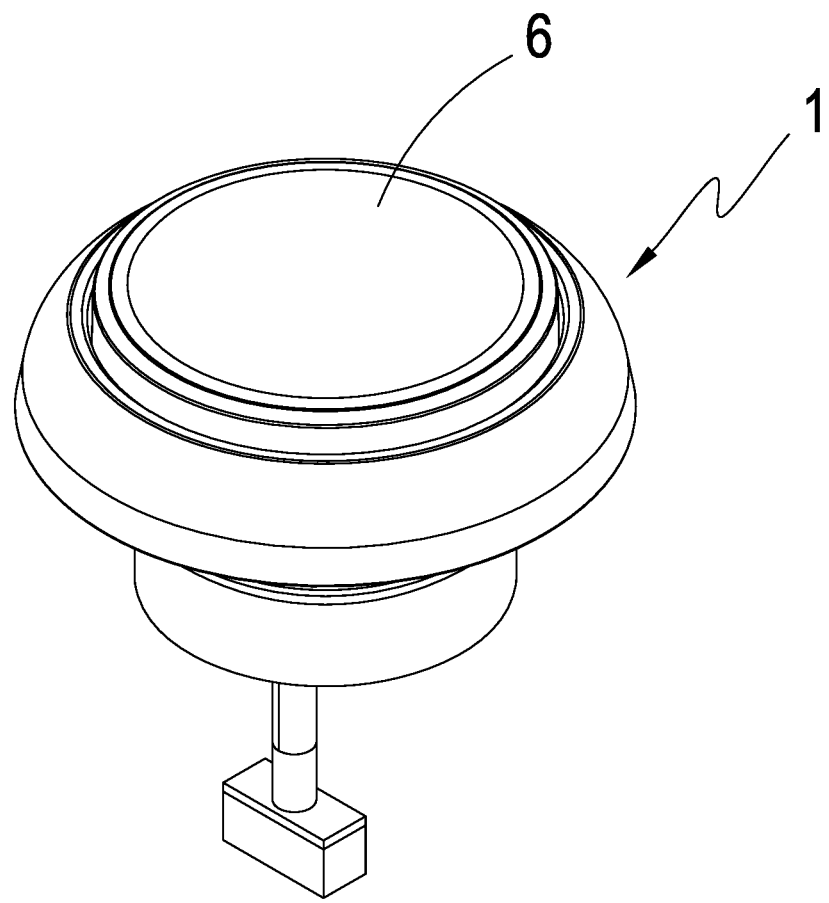
FIG. 1 is a perspective view of a preferred embodiment of the present invention.
Figure 2:
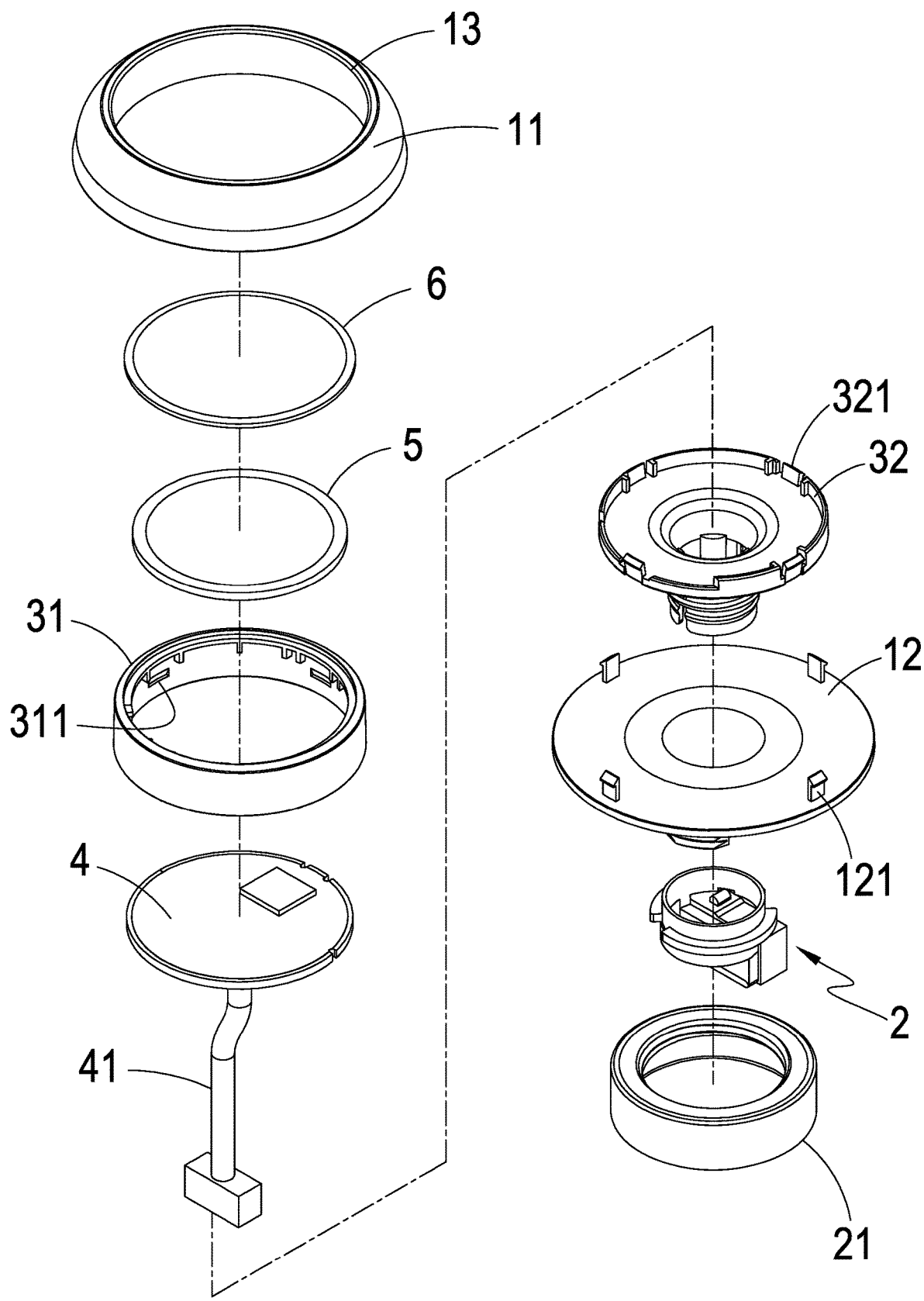
FIG. 2 is an exploded view of the preferred embodiment of the present invention.
Figure 3:
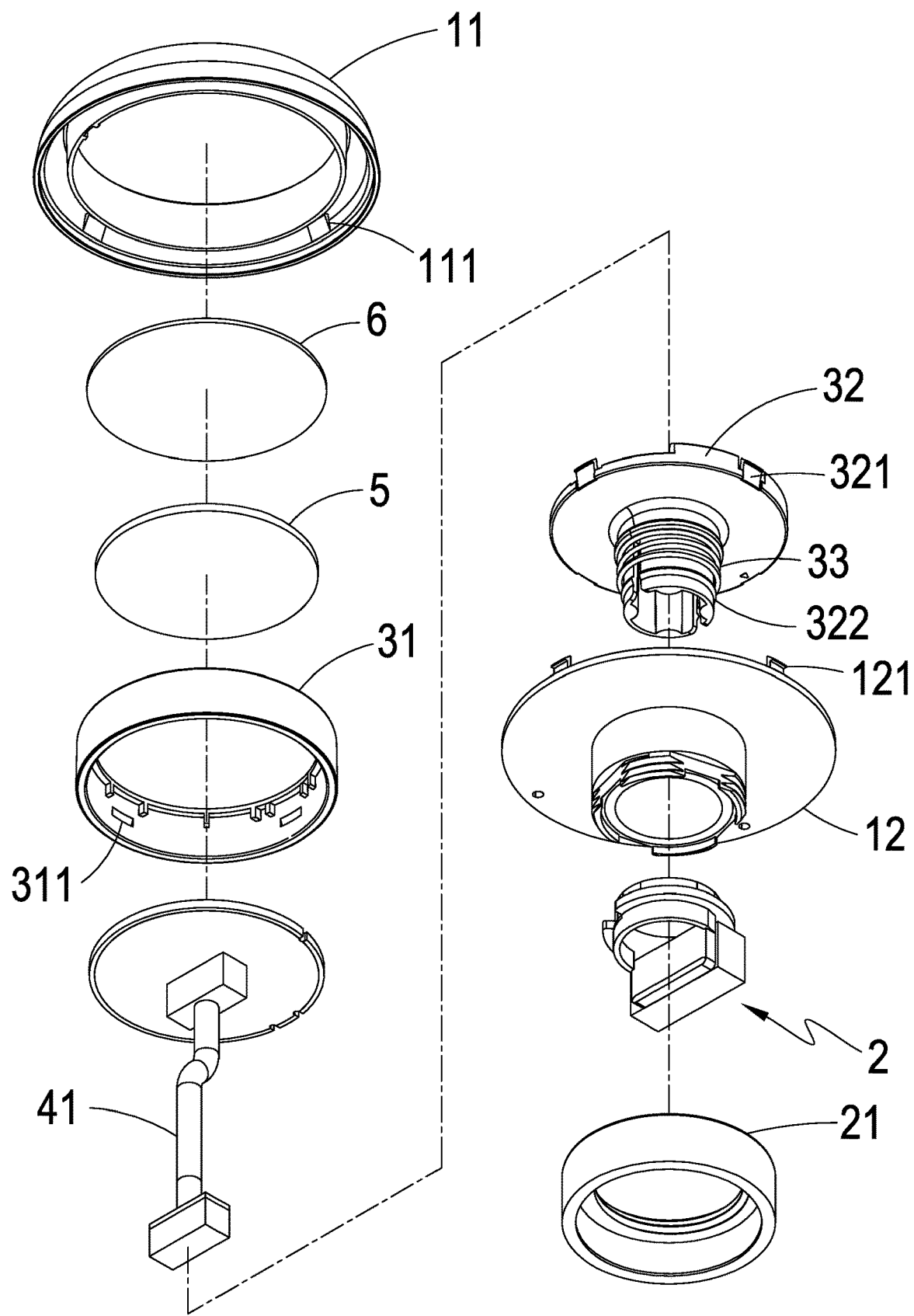
FIG. 3 is another angular exploded view of the preferred embodiment of the present invention.
Figure 4:
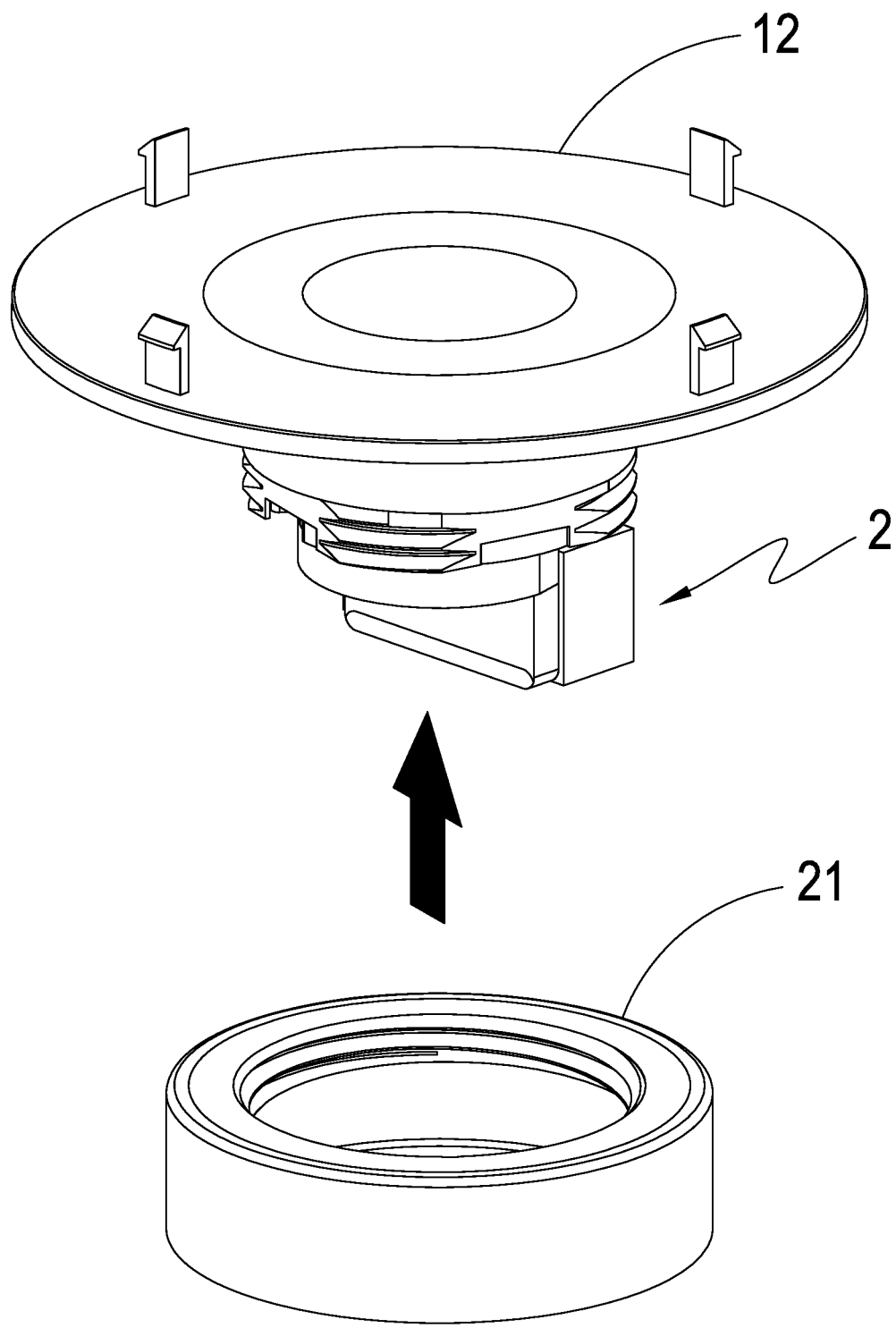
FIG. 4 is a locking-combining schematic diagram of the preferred embodiment of the present invention.
Figure 5:
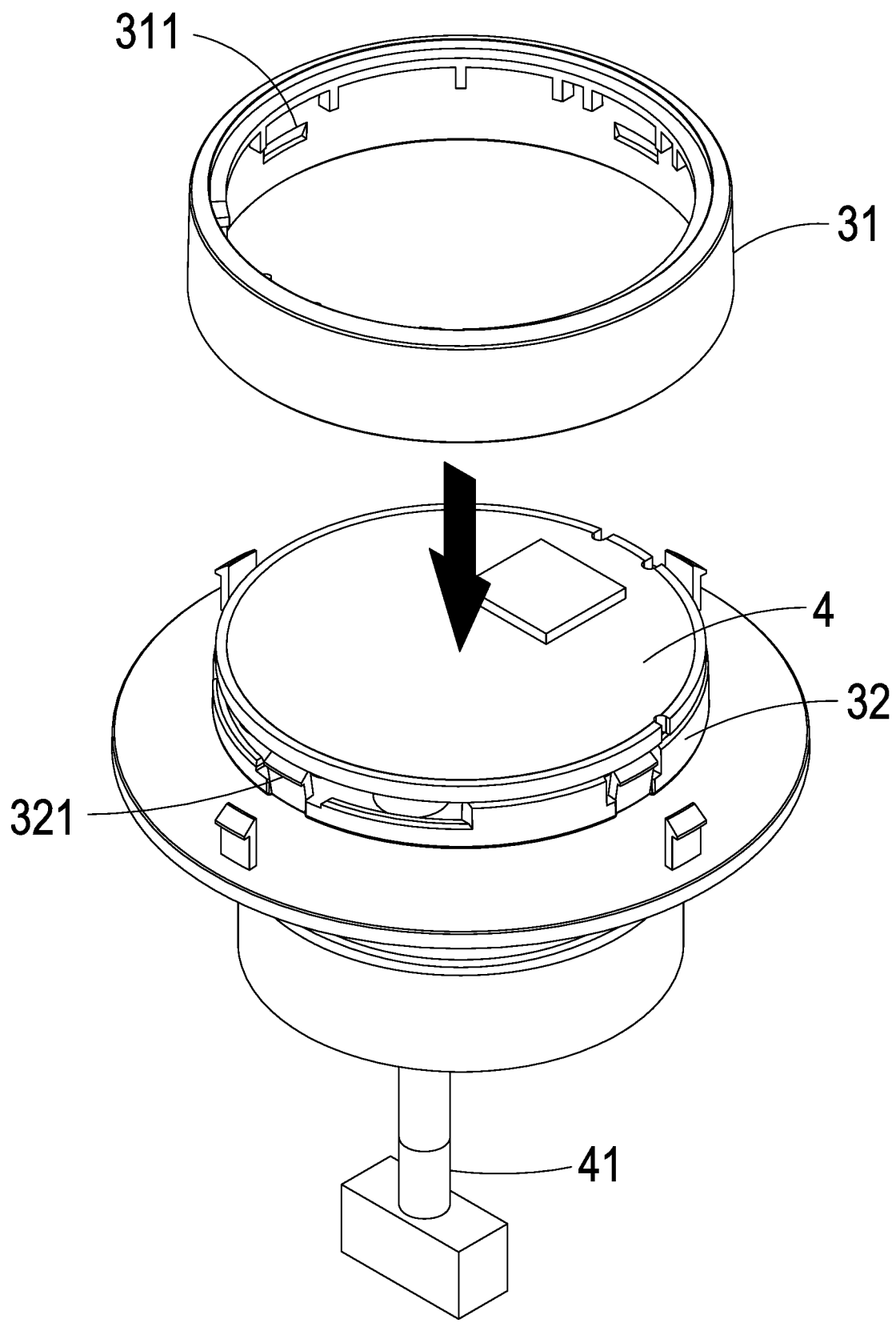
FIG. 5 is an engaging-combining schematic diagram of the button of the preferred embodiment of the present invention.
Figure 6:
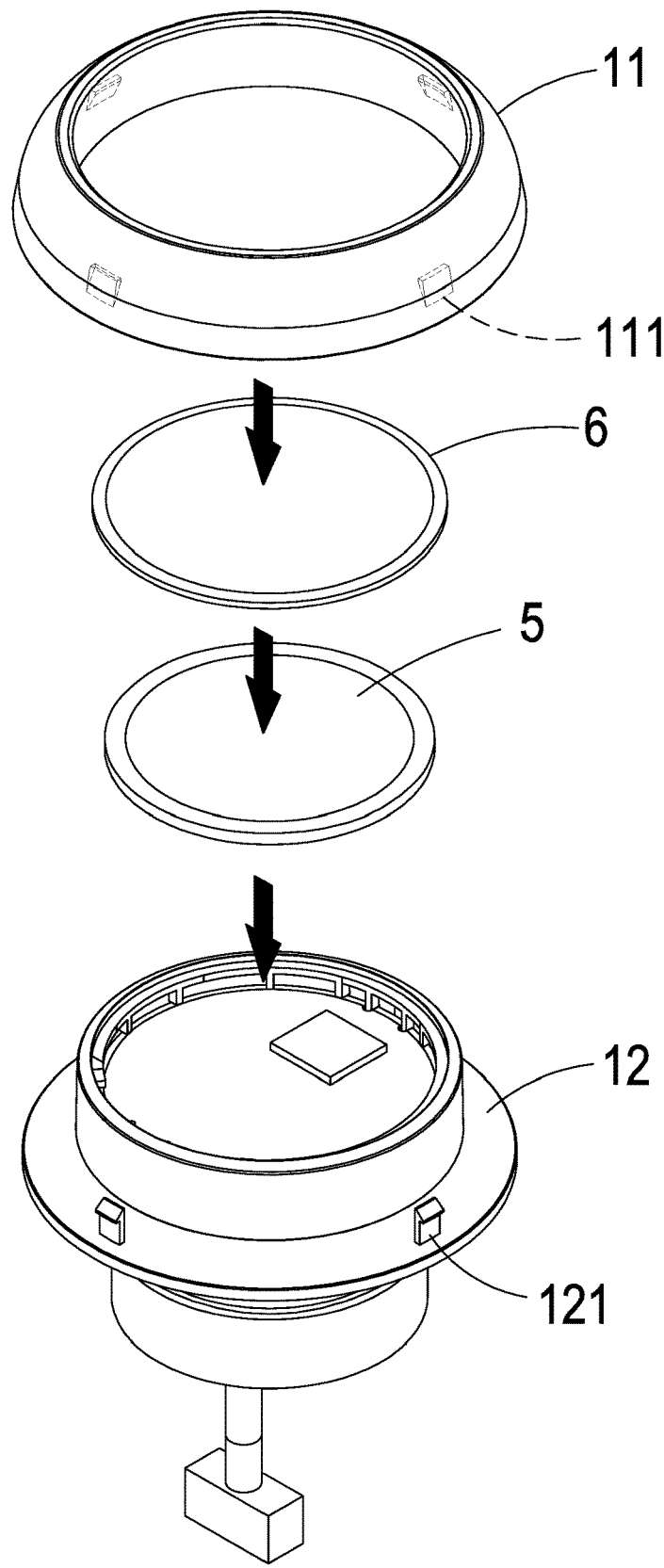
FIG. 6 is an engaging-combining schematic diagram of the housing of the preferred embodiment of the present invention.
Figure 7:
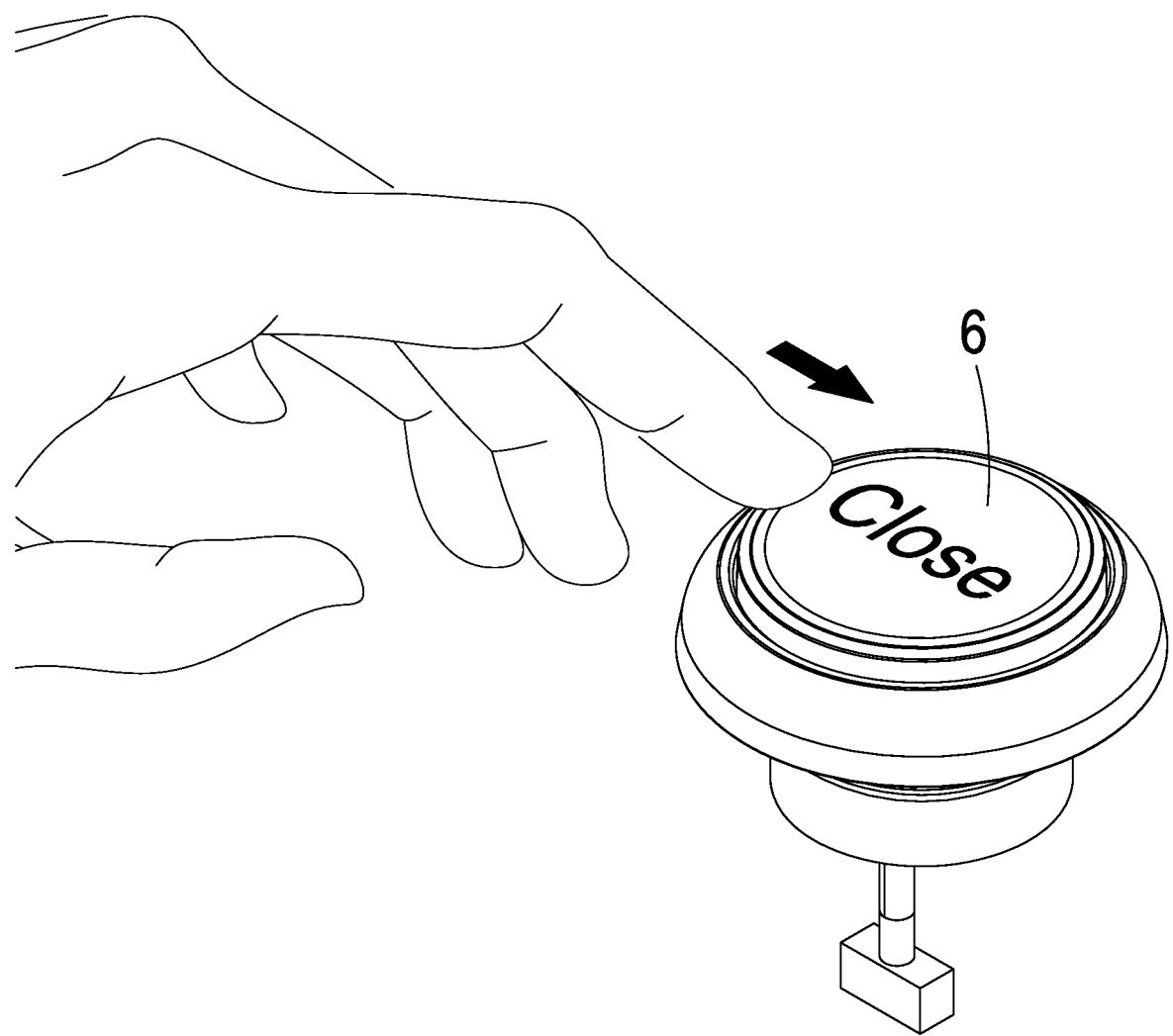
FIG. 7 is a schematic diagram of the preferred embodiment before sliding of the present invention.
Figure 8:
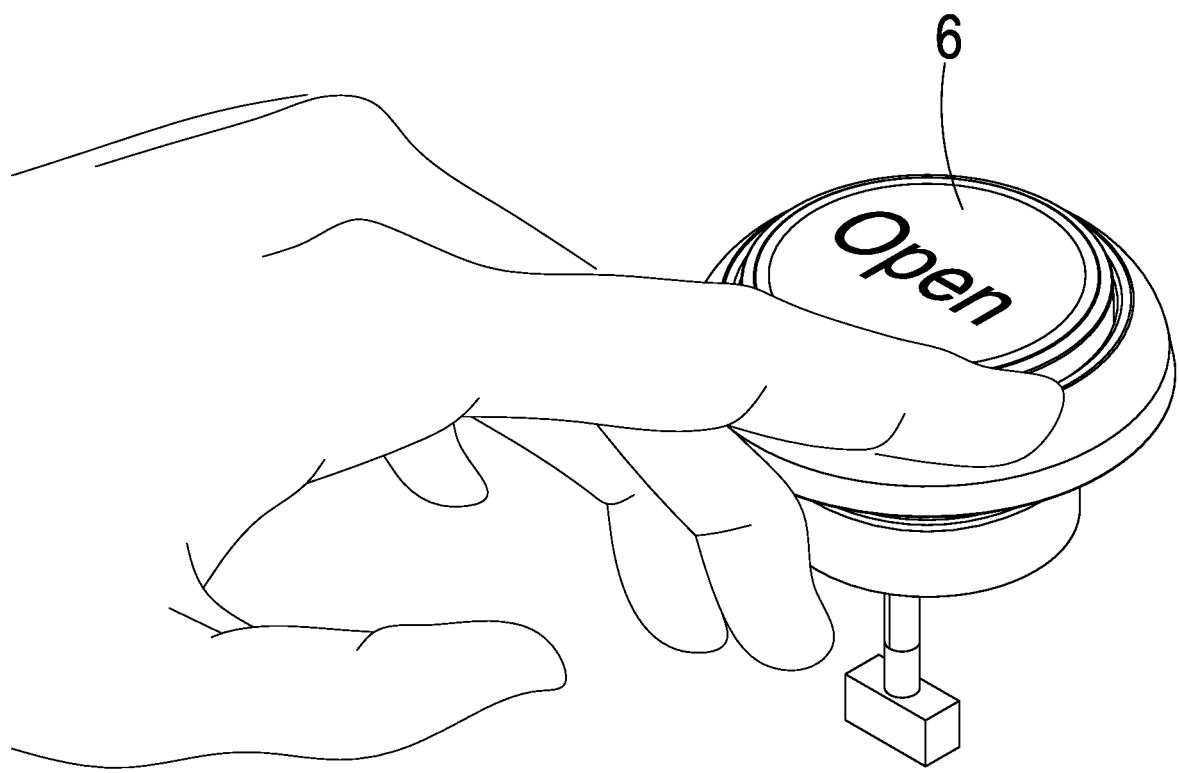
FIG. 8 is a schematic diagram of the preferred embodiment after sliding of the present invention.
Figure 9:
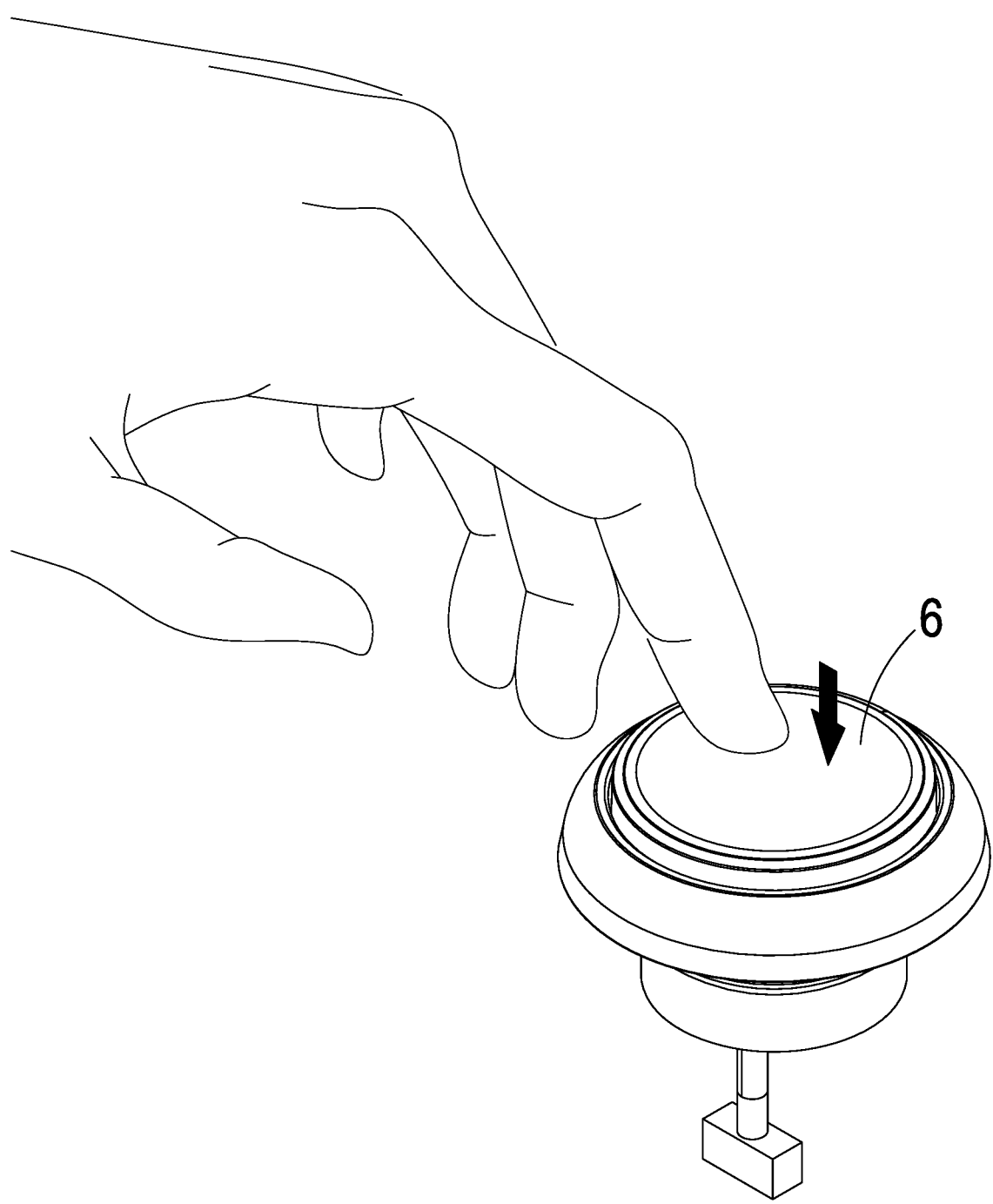
FIG. 9 is a schematic diagram (1) of the preferred embodiment before pushing-pressing of the present invention.
Figure 10:
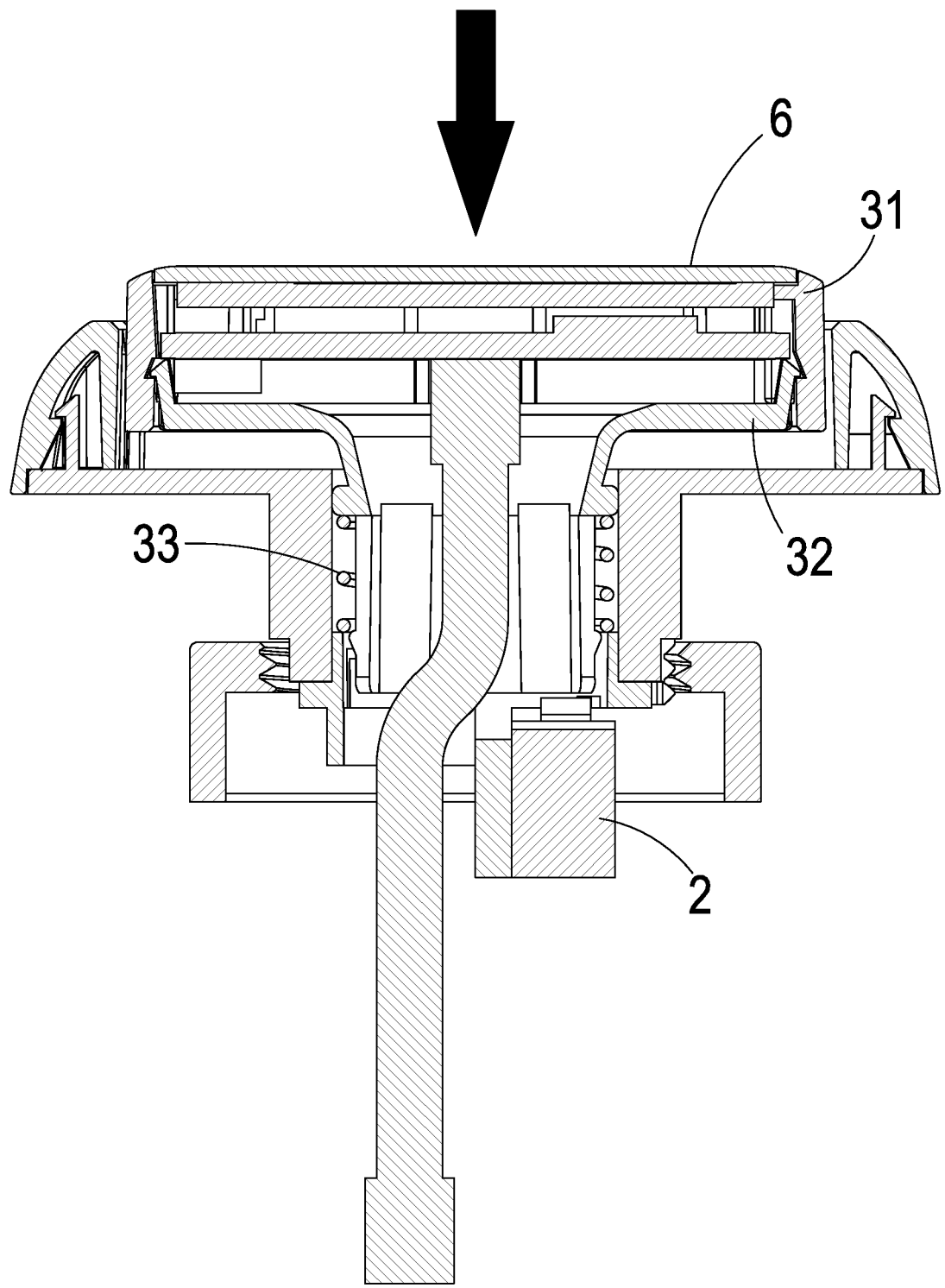
FIG. 10 is a schematic diagram (2) of the preferred embodiment before pushing-pressing of the present invention.
Figure 11:
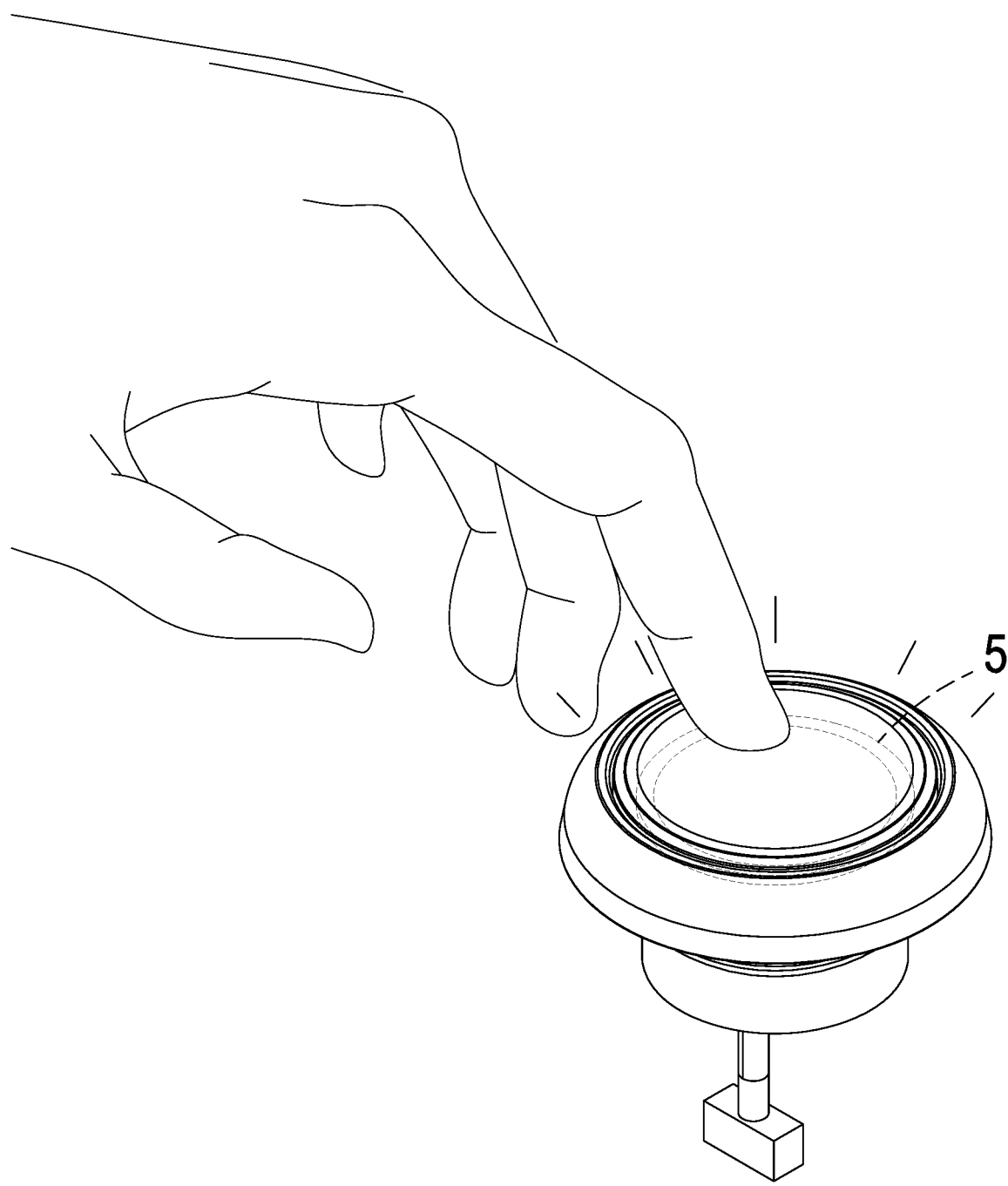
FIG. 11 is a schematic diagram (1) of the preferred embodiment after pushing-pressing of the present invention.
Figure 12:
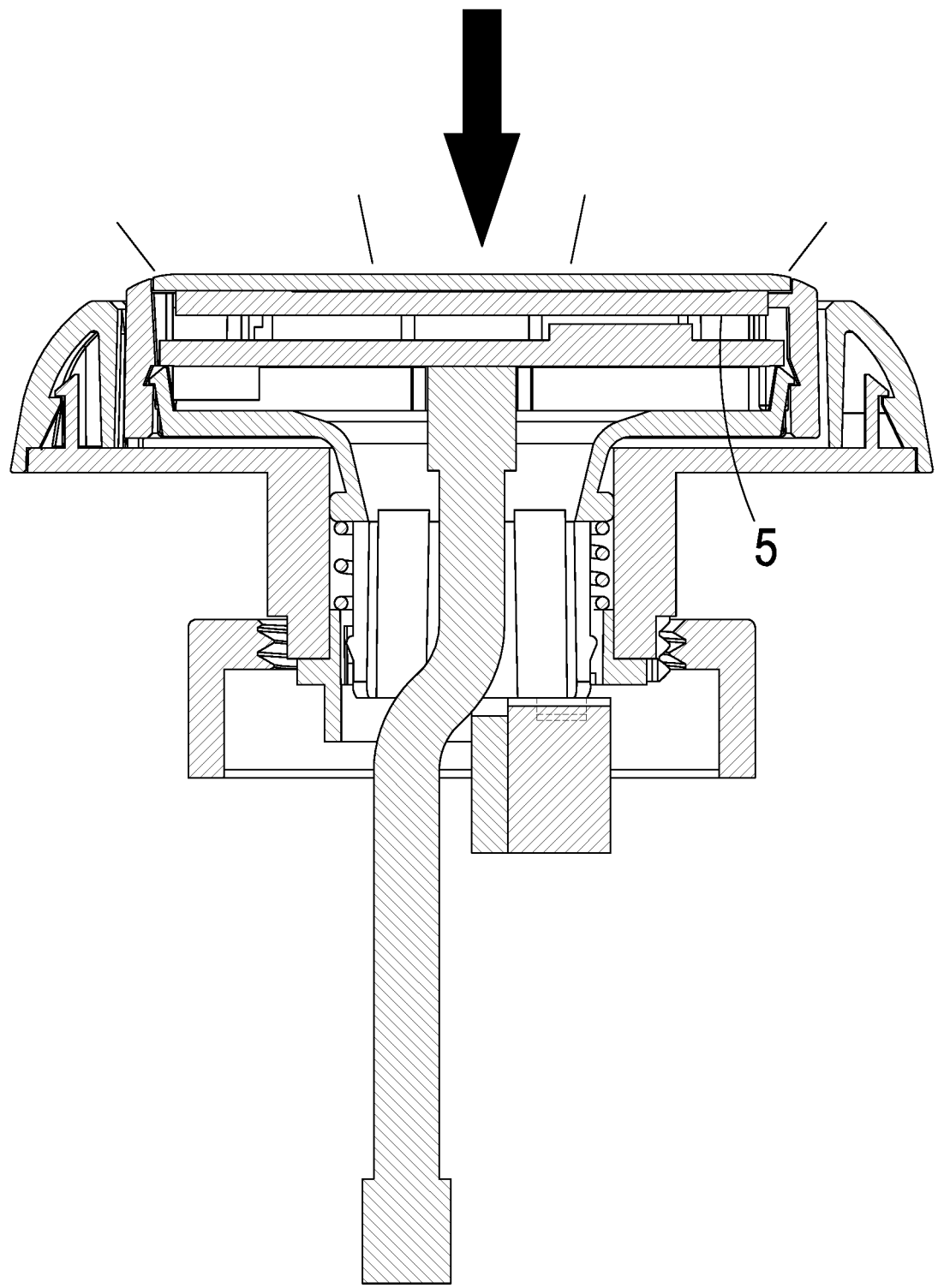
FIG. 12 is a schematic diagram (2) of the preferred embodiment after pushing-pressing of the present invention.

Please refer to the FIG. 1 to FIG. 3, which are respectively the perspective view, exploded view, and another angular exploded view of the preferred embodiment of the present invention. It can be clearly seen from the figures that the present invention comprises: a button housing 1; a button seat 2; a button down-cover 32; an elastic element 33; a signal board 4; a signal connecting-piece 41; a button up-cover 31; a display module 5; a perforation 13; and a touch-control element 6; wherein the button housing 1 comprises a housing down-cover 12 and a housing up-cover 11, which the housing down-cover 12 and the housing up-cover 11 are combined with each other to form the button housing 1. In this embodiment, the housing up-cover 11 has a housing up-connecting portion 111, and the housing down-cover 12 has a housing down-connecting portion 121, thereby being connected with each other to join the housing down-cover 12 and the housing up-cover 11. In this embodiment, the connection is made in an engaging-combining way, but it is not limited. The button seat 2 is fixed to the housing down-cover 12 by a rotating-fixing piece 21, and the button down-cover 32 is set in the button housing 1. An elastic element 33 is set between the button down-cover 32 and the button seat 2, and two position-limiting portions 322 are set on the button down-cover 32, thereby limiting the elastic element 33 to the position-limiting portion 322; wherein the elastic element 33 is a compression spring, whereby the button down-cover 32 can be selectively touched and pressed the button seat 2 and be strongly rebound by the elastic force given by the elastic element 33. The signal board 4 is set on the button down-cover 32, and the signal board 4 is a conventional circuit board for receiving and transmitting signals. One end of a signal connecting-piece 41 is connected with the signal board 4, and the other end is pass out of the button housing 1 through the housing down-cover 12. The button up-cover 31 is set on the button down-cover 32, thereby fixing the signal board 4, and in the embodiment, the button up-cover 31 has at least one button up-connecting portion 311, and the button down-cover 32 has at least one button down-connecting portion 321; they can be connected with each other to fix the button up-cover 31 and the button down-cover 32. The display module 5 is set on the button up-cover 31 and is signally connected with the signal board 4, and the housing up-cover 11 has a perforation 13. The touch-control element 6 is located above the perforation 13 and the display module 5; wherein the touch-control element 6 is also signally connected with the signal board 4; wherein the touch-control element 6 can be a touch panel and the display module 5 can be an LED screen, but it is not limited.

With the above description, the technical structure of the present invention can be understood, and according to the corresponding cooperation of the structure, the button can simultaneously have multiple functions including touch, push-press, and display; and the detailed explanation will be described below.

Please simultaneously refer to FIG. 1 to FIG. 12, which are a perspective view to a schematic diagram (2) after pushing-pressing of the preferred embodiment of the present invention, which can be clearly seen from the figures when the above components are assembled. The user first fixes the button seat 2 to the rotating-fixing piece 21, which the fixing manner can be engaging-combining, locking-combining, etc., which is not limited; and the button seat 2 is further locked to the housing down-cover 12 by means of the threads interlocking with each other. Then, the elastic element 33 is placed in the position-limiting portion 322 of the button down-cover 32; and the button down-cover 32 is placed in the housing down-cover 12 to selectively touch-press the button seat 2; and the signal board 4 is placed on the button down-cover 32. Then, the button up-connecting portion 311 of the button up-cover 31 is engaged and combined with the button down-connecting portion 321, thereby fixing the button up-cover 31 on the button down-cover 32, so that the signal board 4 is fixed between the button up-cover 31 and the button down-cover 32; and then the signal connecting-piece 41 will pass out of the housing down-cover 12 and be located at one side of the button seat 2.

The display module 5 and the touch-control element 6 are set on the button up-cover 31, and are signally connected with the signal board 4, and then the housing up-connecting portion 111 and the housing down-connecting portion 121 are used to fix the housing up-cover 11 to the housing down-cover 12; and the touch-control element 6 is exposed out of the perforation 13.

When using, the signal connecting-piece 41 and the button seat 2 can be connected to a control circuit board, thereby transmitting signals to the control circuit board or transmitting signals to the signal board 4 via the control circuit board. The user can touch or slide the touch-control element 6 to transmit the signal to the control circuit board via the signal board 4 and the signal connecting-piece 41. Or, the user can press the touch-control element 6 to move the button up-cover 31 and the button down-cover 32 linkly, thereby pressing the button seat 2 to transmit signals to the control circuit board via the button seat 2; then, the touch-control element 6, the button up-cover 31, and the button down-cover 32 are simultaneously rebounded by the elastic force given by the elastic element 33. And, the control circuit board can feedback the message to the display module 5 according to the received signals and through the signal connecting-piece 41 and the signal board 4. Therefore, the display module 5 can be adjusted by pressing or touching by the user; for example, when sliding from left to right will convert "Close" to "Open", or the display module 5 will emits light after being pressed, etc., and the above-mentioned usage modes are only examples, and they are not limited. In this way, the button can simultaneously have the multiple functions including touch-control, press, and display to achieve the diversified usage effects.

Therefore, the press-touch-control device having screen display of the present invention can improve the conventional technology, whereof the technical key is that: Through the touch-control element 6, the display module 5, and the button seat 2, the present invention can simultaneously have a touch-control mode and a press-control mode, and can transmit signals to the display module 5 for displaying to achieve diversified usage effects.

I claim:

1. A press-touch-control device having screen display, which mainly comprises:
    a button housing comprising a housing down-cover and a housing up-cover set on the housing down-cover;
    a button seat set on the housing down-cover;
    a button down-cover set in the button housing and movable relative to the button seat to selectively touch the button seat;
    an elastic element arranged between the button seat and the button down-cover;
    a signal board set on the button down-cover;
    a signal connecting-piece, wherein the signal connecting-piece has a first end connected with the signal board and an opposite, second end extending out of the button housing through the housing down-cover;
    a button up-cover set on the button down-cover providing for fixing the signal board on the button down-cover, such that the signal board is retained between the button up-cover and the signal board;
    a display module set on the button up-cover and signally connected with the signal board;
    a perforation formed in the housing up-cover; and
    a touch-control element set on the display module and located in the perforation, wherein the touch-control element is signally connected with the signal board.

2. The press-touch-control device having screen display according to claim 1, wherein the second end of the signal connecting-piece that is opposite to the first end connected with the signal board is adapted to connect with a control circuit board.

3. The press-touch-control device having screen display according to claim 1, wherein the button seat is set with a rotating-fixing piece and is fixed with the housing down-cover via the rotating-fixing piece.

4. The press-touch-control device having screen display according to claim 1, wherein the housing up-cover is set with at least one housing up-connecting portion.

5. The press-touch-control device having screen display according to claim 4, wherein the housing down-cover is set with at least one housing down-connecting portion which is corresponding to and engageable with the housing up-connecting portion.

6. The press-touch-control device having screen display according to claim 1, wherein the button up-cover is set with at least one button up-connecting portion.

7. The press-touch-control device having screen display according to claim 6, wherein the button down-cover is set with at least one button down-connecting portion which is corresponding to and engageable with the button up-connecting portion.

8. The press-touch-control device having screen display according to claim 1, wherein the button down-cover is set with at least one position-limiting portion which constrains the elastic element in position.

* * * * *